United States Patent [19]

Morton

[11] Patent Number: 4,918,637
[45] Date of Patent: Apr. 17, 1990

[54] MULTICHANNEL DECIMATION/INTERPOLATION FILTER

[75] Inventor: Douglas W. Morton, Everett, Wash.

[73] Assignee: Hewlett-Packard Company, Palo Alto, Calif.

[21] Appl. No.: 415,371

[22] Filed: Sep. 26, 1989

Related U.S. Application Data

[60] Continuation of Ser. No. 323,512, Mar. 13, 1989, abandoned, Division of Ser. No. 3,158, Jan. 13, 1987, Pat. No. 4,881,191.

[51] Int. Cl.⁴ ............................................. G06F 15/31
[52] U.S. Cl. ............................... 364/724.17; 364/724.1
[58] Field of Search ..................... 364/724.13, 724.17, 364/724.19, 724.1

[56] References Cited

U.S. PATENT DOCUMENTS

| | | | |
|---|---|---|---|
| 3,629,509 | 5/1969 | Glasser | 364/724.13 X |
| 4,344,149 | 8/1982 | Van de Meeberg et al. | 364/724.1 |
| 4,356,559 | 10/1982 | Candy et al. | 364/724.17 X |
| 4,317,092 | 2/1983 | Potter | 364/724.16 X |
| 4,694,415 | 9/1987 | Hasenkopf et al. | 364/724.19 |
| 4,701,956 | 10/1987 | Katoh | 364/724.13 X |
| 4,809,209 | 2/1989 | Nillesen | 364/724.17 X |

Primary Examiner—Gary V. Harkcom
Assistant Examiner—Tan V. Mai

[57] ABSTRACT

A multichannel, digital filter capable of operation in either decimation or interpolation mode receives sequences of time multiplexed sampled from M input channels and filters the input values from each channel to produce filtered output data for each channel. The filter includes N serially connected digital low pass filters for each channel. Low pass filter $N+1$ is executed only half as often as low pass filter N, thereby providing a decimation or interpolation function, depending on which mode is selected. The filter may include apparatus for sequencing the low pass filters and for storing the state variables employed by such filters. In decimation mode, the filter may either operate in a single or multipass mode.

5 Claims, 13 Drawing Sheets

| ADDER INPUT | SHIFT REGISTER DEC. | SHIFT REGISTER BINARY | PASS | CSTART | CHANNEL |
|---|---|---|---|---|---|
|  | 0 | 0 0 0 [0] | 1 | 0 | 1 |
| +1 | 1 | 0 0 [0] 1 | 2 | 0 | 1 |
| −1 | 0 | 0 0 0 [0] | 1 | 0 | 2 |
| +1 | 1 | 0 0 [0] 1 | 2 | 0 | 2 |
| −1 | 0 | 0 0 0 [0] | 1 | 0 | 3 |
| +1 | 1 | 0 0 [0] 1 | 2 | 0 | 3 |
| −1 | 0 | 0 0 0 [0] | 1 | 0 | 4 |
| +1 | 1 | 0 0 [0] 1 | 2 | 0 | 4 |
| +1 | 2 | 0 0 1 [0] | 1 | 1 | 1 |
| +1 | 3 | 0 [0] 1 1 | 3 | 0 | 1 |
| −1 | 2 | 0 0 1 [0] | 1 | 1 | 2 |
| +1 | 3 | 0 [0] 1 1 | 3 | 0 | 2 |
| −1 | 2 | 0 0 1 [0] | 1 | 1 | 3 |
| +1 | 3 | 0 [0] 1 1 | 3 | 0 | 3 |
| −1 | 2 | 0 0 1 [0] | 1 | 1 | 4 |
| +1 | 3 | 0 [0] 1 1 | 3 | 0 | 4 |
| +1 | 4 | 0 1 0 [0] | 1 | 2 | 1 |
| +1 | 5 | 0 1 [0] 1 | 2 | 1 | 1 |
| −1 | 4 | 0 1 0 [0] | 1 | 2 | 2 |
| +1 | 5 | 0 1 [0] 1 | 2 | 1 | 2 |
| −1 | 4 | 0 1 0 [0] | 1 | 2 | 3 |
| +1 | 5 | 0 1 [0] 1 | 2 | 1 | 3 |
| −1 | 4 | 0 1 0 [0] | 1 | 2 | 4 |
| +1 | 5 | 0 1 [0] 1 | 2 | 1 | 4 |
| +1 | 6 | 0 1 1 [0] | 1 | 3 | 1 |
| +1 | 7 | [0] 1 1 1 | 4 | 0 | 1 |

MULTICHANNEL DECIMATION/INTERPOLATION FILTER

CROSS REFERENCE TO RELATED APPLICATION

This is a continuation of application Ser. No. 07/323,512, now abandoned, which was filed Mar. 13, 1989, which was a division of application Ser. No. 07/003,158, now U.S. Pat. No. 4,881,191 filed Jan. 13, 1987.

FIELD OF THE INVENTION

The present invention relates to digital filters and, in particular, to digital filters capable of performing decimation and/or interpolation functions.

BACKGROUND OF THE INVENTION

Historically, a modal analysis system consisted of a two-channel measurement instrument, together with a source of excitation such as a sine wave, a hammer striker or random noise generator. Measuring a structure for its modal characteristics under these conditions is fairly straightforward, but is also tedious due to the necessity of placing accelerometers at several different points on the object to be measured, and repeating the measurement. As the measurements became more complex, and as new modal analysis algorithms placed constraints on how measurements could be made, the need for more data collection and more measurement channels arose.

Although in principle it would be possible to simply add more measuring instruments to increase the data capacity, a practical limit of cost and complexity is soon reached. As a result, there is a need for a measuring instrument that is capable of efficiently processing a number of input channels.

SUMMARY OF THE INVENTION

The present invention provides a digital filter capable of operation either in decimation or interpolation mode. The filter possesses the distinct advantage that it can process an input data stream consisting of time multiplexed samples from a plurality M of input channels, and that the value M can be easily reconfigured by an associated processor.

In a preferred embodiment, the digital, multichannel filter of the present invention includes means for receiving digital channel input data comprising a sequence of time multiplexed samples from M input channels, M being greater than one, means for receiving and storing channel number data representing the number of channels M, and digital filter means for low pass filtering the channel input data from each channel to produce channel output data for each channel. The digital filter means comprises N digital low pass filters for each channel, the low pass filters being numbered and ordered from 1 through N such that low pass filters n and n+1 are serially connected for all n from 1 to N−1. Each low pass filter comprises a plurality of state variables, means for receiving pass input data, and means for producing pass output data.

The multichannel filter may comprise a decimation filter, an interpolation filter, or, in a preferred embodiment, the multichannel filter may comprise means for receiving and storing mode data representing either decimation mode or interpolation mode, and means responsive to the mode data for operating as a decimation or interpolation filter, respectively. When the mode data represents decimation mode, for each channel, low pass filter 1 receives a portion of the channel input data for the channel as pass input data, a portion of the pass output data produced by low pass filter n is provided as pass input data to low pass filter n+1, where n is greater than zero and less than N, and the channel output data for each channel comprises the pass output data of low pass filter N for that channel. When the mode data represents interpolation mode, for each channel, low pass filter N receives the channel input data for that channel as pass input data, the pass output data produced by low pass filter n comprises a portion of the pass input data to low pass filter n−1, where n is greater than 1 and less than N+1, and the pass output data of low pass filter 1 comprises the channel output data for the channel.

In a preferred embodiment, the digital filter means comprises a processor for executing the N low pass filters for the M channels, the execution of each low pass filter comprising the performance by the processor of a sequence of processing steps. During each processing step, an input data value is received, an output data value is produced, and state variables are recalculated. The digital filter means further includes sequencing means for determining the order in which processing steps for the low pass filters are executed. In a preferred sequence, the processing steps occur in a predetermined pattern in which one or more processing steps for selected low pass filters for a given channel are performed, and the same set is then repeated for each of the other channels. The sequencing means preferably operates such that low pass filter n+1 is executed only one-half as often as low pass filter n for all n from 1 to N−1, and such that each set comprises a processing step for low pass filter 1 and a processing step for a low pass filter having a number greater than 1. Novel means are also described for implementing the sequencing means and for the storage of the state variables of the low pass filters in RAM, such that the number of required memory accesses per processing step is reduced.

In a further embodiment, the digital filter means comprises a decimation filter including N1 digital low pass filters for each channel, means for receiving and storing data representing an output pass number N, and mode data representing either single or multiple pass output. The channel output data for each channel comprises the pass output data of low pass filter N when the mode data represents single pass output, and comprises the pass output data of low pass filters N through N1 when the mode data represents multiple pass output.

BRIEF DESCRIPTION OF THE DRAWINGS

FIG. 9 is a table illustrating the generation of a preferred sequence of pass, channel and CSTART values;

FIG. 10 is a table showing the derivation of the sequence of pass values for each channel;

DETAILED DESCRIPTION OF THE INVENTION

Figure 1:
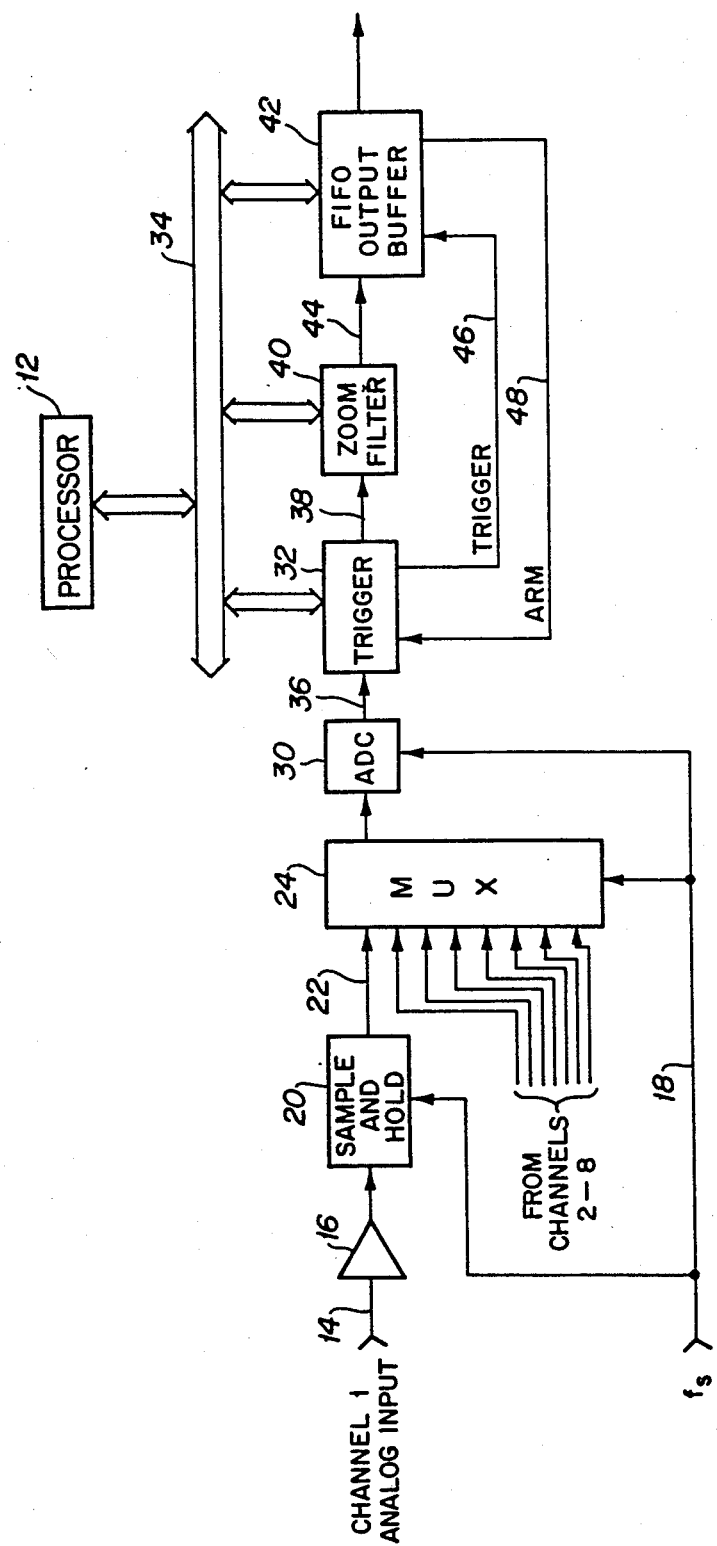
FIG. 1 is a block diagram of a portion of a data analysis system that includes the multichannel filter of the present invention.

The present invention provides a multichannel digital filter that is capable of processing multiple independent channels of time multiplexed input data. The multichannel filter is capable of operating in either decimation or interpolation mode. A typical arrangement for utilizing the multichannel filter in decimation mode is illustrated by the data analysis system shown in FIG. 1. The system includes processor 12 and zoom filter 40 that includes the multichannel filter of the present invention. Analog input data on line 14 is amplified by amplifier 16, and the amplified input data is sampled by sample and hold circuit 20 under the control of a sample clock signal $f_s$ on line 18. Sample and hold circuit 20 produces a series of analog samples on line 22 that are input to analog multiplexer 24. Multiplexer 24 multiplexes the signals from sample and hold circuit 20, as well as from a plurality of other input channels. In the example shown in FIG. 1, there are a total of eight input channels illustrated. Multiplexer 24 cylindrically selects one of the eight input channels for connection to analog to digital converter (ADC) 30. Multiplexer 24 and ADC 30 also operate in response to the sample clock signal $f_s$.

The digital samples produced by ADC 30 are processed through a data path that includes trigger circuit 32, zoom filter 40, and FIFO output buffer 42, each of these components being linked to processor 12 via bus 34. Zoom filter 40 includes the multichannel filter of the present invention, and is described in detail below. In general, a zoom filter permits the system to collect only that data in the time domain that corresponds to a preselected range in the frequency domain.

The intermixed digital samples from the eight input channels are input to trigger circuit 32 via line 36, and are passed by the trigger circuit to zoom filter 40 via line 38. Trigger circuit 32 examines the data in each channel for the occurrence of a preestablished triggering pattern. Triggering patterns may be similar to those found in a conventional oscilloscope, wherein triggering is determined based upon the magnitude and slope of an input signal. Zoom filter 40 receives the multiplexed digital samples from the trigger circuit, and applies a predetermined zoom filtering operation on the data from each channel. The result is a series of digital samples, at a lower sampling rate, that are passed from the zoom filter to FIFO output buffer 42 via bus 44.

The function of output buffer 42 is to sort the data provided by the zoom filter into separate blocks for each channel. The output buffer begins collecting data for a given channel when the output buffer receives an appropriate trigger signal on line 46 from trigger circuit 32. Once a prescribed amount of data has been collected for a given channel, the output buffer sends the data to a subsequent processing stage, such as a processor for performing an FFT analysis of the data. In some cases, a triggering event occurs at the end, rather than the beginning, of a data sequence of interest. To provide for this situation, output buffer 42 may continually collect data from zoom filter 40, and issue an arm signal on line 48 when it has completely filled a specified number of memory positions. The arm signal informs the trigger circuit that the specified number of data points has been collected, and enables the trigger circuit to produce the trigger signal on line 46.

Figure 2:
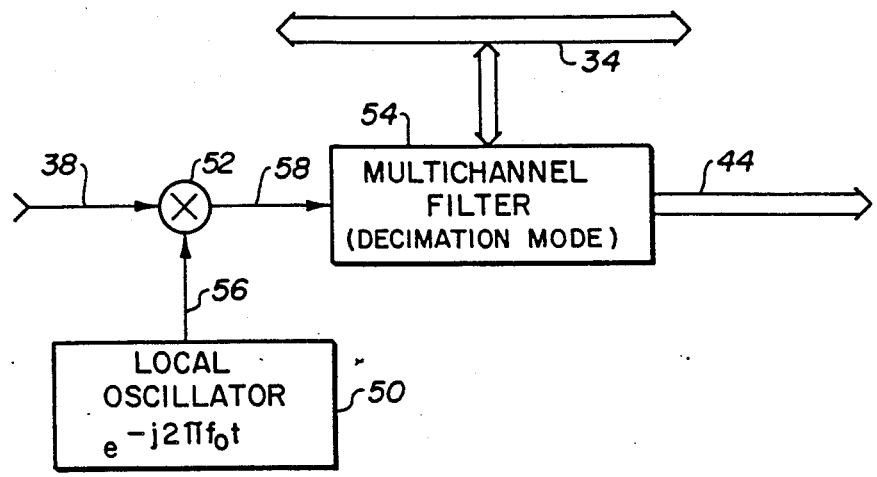
FIG. 2 is a block diagram of the zoom filter of FIG. 1.

The basic principles behind a zoom filter are illustrated in FIGS. 2 and 3. The zoom filter shown in FIG. 2 comprises local oscillator 50, mixer 52, and multichannel filter 54 operating in decimation mode. The multichannel filter receives information from processor 12 via bus 34 that indicates the number of channels of multiplexed input data, the number of passes that should be performed, and whether decimation or interpolation mode should be used. FIG. 2 illustrates the data flow in decimation mode wherein for each of M channels, mixer 52 mixes the digital input signals on line 38 with a periodic modulation signal produced by local oscillator 50 on line 56. The resulting digital data values are then transferred in a serial format via line 58 to multichannel filter 54. In the illustrated embodiment, the modulation function produced by local oscillator 50 is a complex function, and mixer 52 thereby composes a pair of mixers (not individually illustrated), such that the real input data on line 38 is converted to complex data on line 58. The multichannel filter filters each channel of complex data on line 58, to produce parallel format, multi-channel complex data on output bus 44 at a reduced sampling rate. As described more fully below, the data flow in interpolation mode is reversed, with multichannel filter 54 receiving input data from bus 44, and sending serial output data to mixer 52 via line 58.

Figure 3A:
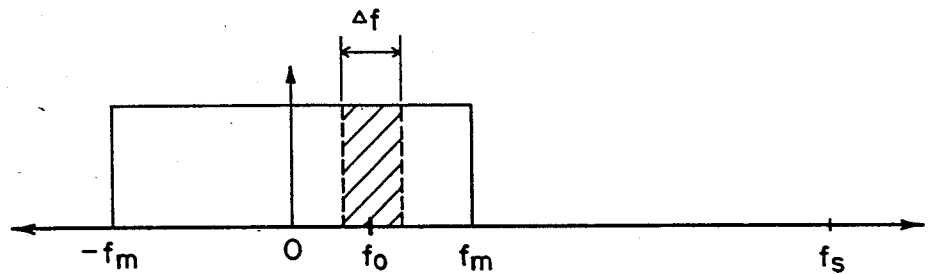
FIGS. 3A and 3B are graphs showing the effect of zoom filtering on an input signal.
Figure 3B:
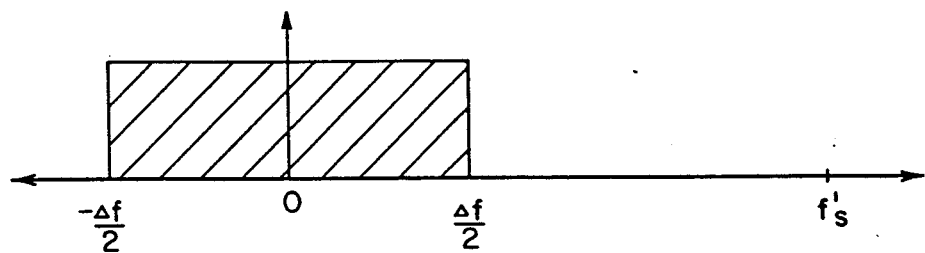

FIG. 3A shows the frequency spectrum of a hypothetical input signal for a single channel. As indicated, the spectrum extends from $-f_m$ to $+f_m$. To avoid losing possibly relevant data, such a signal should be sampled at a sampling frequency $f_s$ that is at least twice as large as $f_m$. However, if the only frequency range of interest for a particular analysis was the range $\Delta f$ centered about frequency $f_0$, a zoom filter could be used to collect only that data (in the time domain) that corresponds to frequency range $f_0 - \Delta f/2$ in the frequency domain. The zoom filter operates by first modulating the input signal with the function $e^{-j2\pi f_0 t}$. The result of such modulation is to shift the frequency spectrum to the left along the frequency axis for a distance $f_0$. From inspection of FIG. 3A, it can be seen that the result would be to shift the range of interest to the origin. Once the range has been so shifted, the data can be low pass filtered without losing data that corresponds to the frequency range of interest. The result is schematically illustrated in FIG. 3B, wherein the scale on the horizontal (frequency) axis has been expanded with respect to FIG. 3A. In FIG. 3B, it is assumed that the low pass filtering has been performed, and has been effective to eliminate all frequencies having a magnitude greater than $\Delta f/2$. A new sampling rate $f_s$ may now be selected that is much smaller than $f_s$. It will be apparent that the use of a local oscillator/mixer is not required, if the frequency range of interest is at or near the origin.

Figure 4:
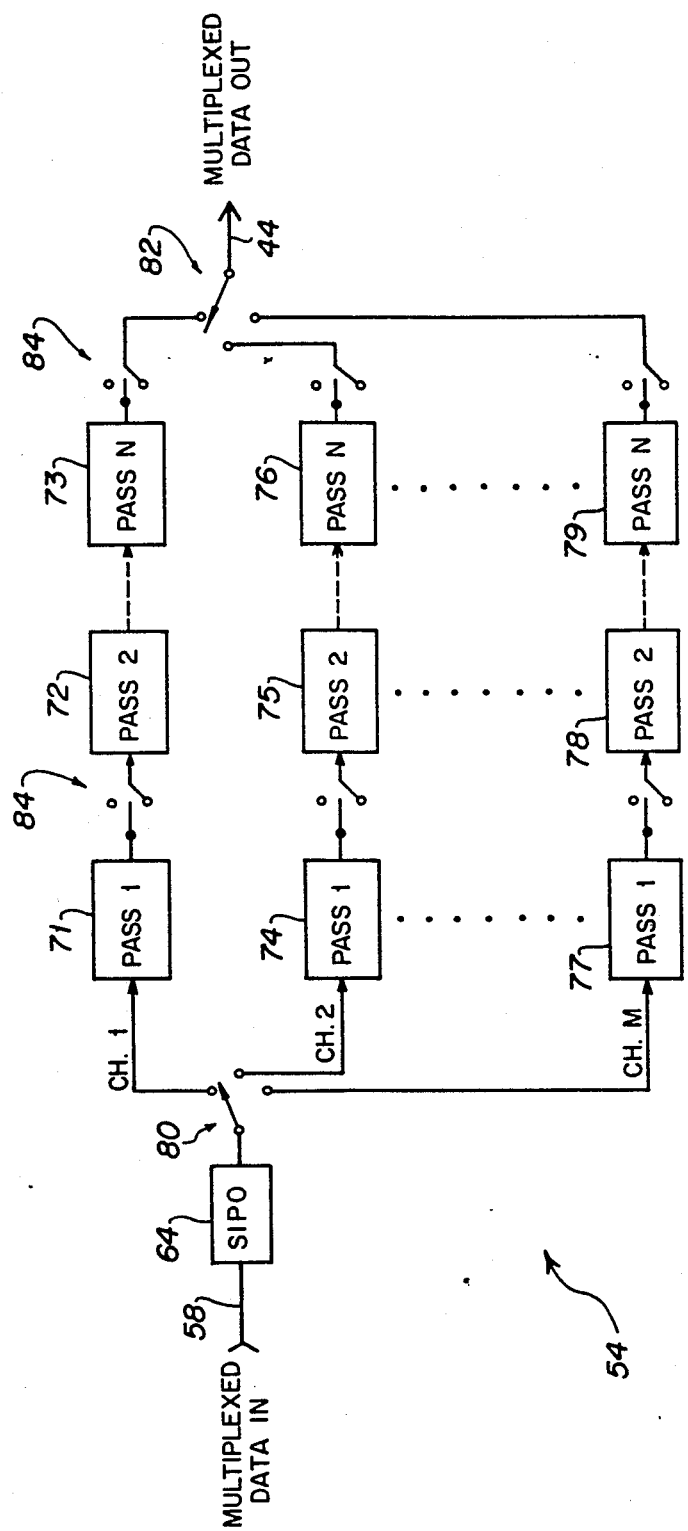
FIG. 4 is a schematic diagram showing the arrangement of low pass filters in decimation mode.

A conceptual model of the decimation mode operation performed by multichannel filter 54 is presented in FIG. 4. As in FIG. 2, reference numeral 58 represents the serial data line from the local oscillator and mixer, and reference numeral 44 represents the parallel output bus to the FIFO output buffer. The decimation filter schematically illustrated in FIG. 4 comprises an array of low pass filters 71–79. Multiplexed input data on line 58 is first converted to parallel form by serial-in/parallel-out (SIPO) circuit 64, and then routed by "switch" 80 to the appropriate low pass filter in the first column in FIG. 4, i.e., to low pass filter 71, 74 or 77 depending upon the channel to which the data pertains. For each channel, the data passes to the right through a series of N low pass filters, and finally passes through "switch" 82 to emerge as multiplexed output data on bus 44. For example, data pertaining to channel 1 is filtered by low pass filters 71–73, data pertaining to channel 2 is filtered by low pass filters 74–76, etc. For each channel, the first low pass filtering operation is designated PASS 1, the second low pass filtering operation is designated PASS 2, etc., up to PASS N. In FIG. 4, a total of M channels are indicated, each channel comprising N low pass filters. In the preferred embodiment, N is the same for all channels. However, this is not a requirement for the multichannel filter of the present invention.

A digital filter such as low pass filter 71 can be conceived of as a set of invariant processing rules, together with a set of time and data dependent state variables. The processing rules can be implemented entirely in hardware, as with a set of logic gates, etc., or entirely in software using a general purpose digital computer, or in a hybrid (e.g. reprogrammable hardware) fashion as in the preferred embodiment described in detail below. For example, in the embodiment to be described, the processing rules are embodied in an ALU unit and its associated control logic, and the state variables are stored in a separate RAM memory. Therefore when reference is made herein, for example, to low pass filter 71, it is to be understood that the low pass filter may not occupy a defined physical area on a circuit board, i.e., a digital filter may not comprise a "circuit", as that term is commonly understood.

The decimation function provided by multichannel filter 54 is symbolically illustrated by switches 84. Switches 84 cause a predetermined portion of the output data of each low pass filter to be routed to the following stage, and cause the remaining output data to be discarded. In a preferred embodiment, this predetermined portion is one-half. Thus each switch 84 can be conceived of as flipping back and forth between a first state in which the output of a low pass filter is coupled to the input of the following low pass filter or to switch 82, and a second state in which the output of the low pass filter is simply discarded. Thus for a total of N passes, the multichannel filter shown in FIG. 4 reduces the sampling rate by a factor of $2^N$.

In a preferred embodiment, the multichannel filter of the present invention is capable of operating in either decimation mode or interpolation mode. Furthermore, within decimation mode, the multichannel filter is capable of operating in a single output mode, and in a multiple pass output mode. Interpolation mode is discussed below, and in general involves a reversal of the data flow shown in FIGS. 1, 2 and 4. In single pass output decimation mode, the multichannel filter operates as illustrated in FIG. 4, with pass N providing the output for each channel. In multiple pass output mode, there are N1 low pass filters for each channel, and the output data for each channel comprises the output of low pass filters N through N1. The principal purpose of multiple pass output mode is that it enables the data to be subsequently processed, such as by multiple FFT routines, to produce constant percent bandwidth data in the frequency domain, i.e., to produce frequency domain data in which the width of each frequency band is a constant percentage of the center frequency of the frequency band. As described below, in a preferred embodiment, multiple pass output mode produces only twice as much output data as single pass output mode, regardless of the difference between N and N1, because each pass n +1 is executed only half as often as pass n.

Figure 5:
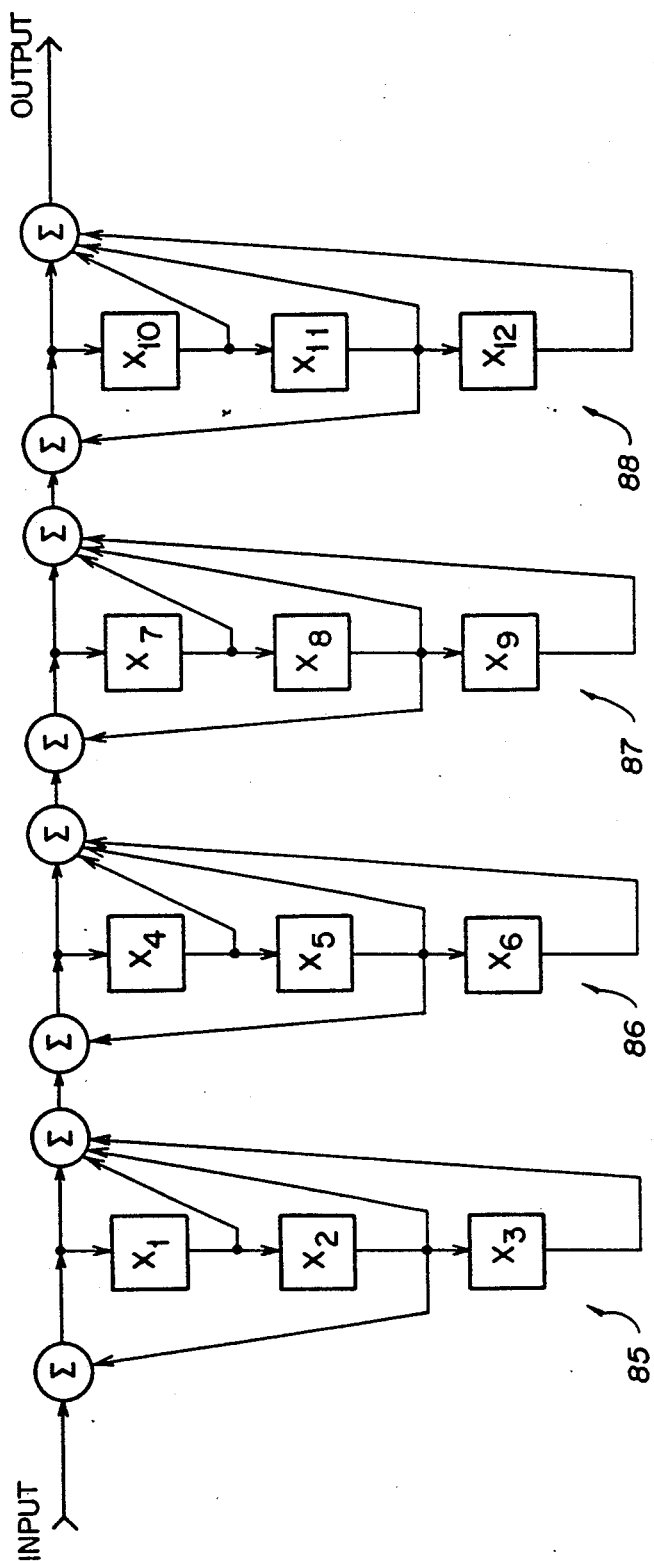
FIG. 5 is a state diagram showing one preferred embodiment of a low pass filter.
Figure 7:
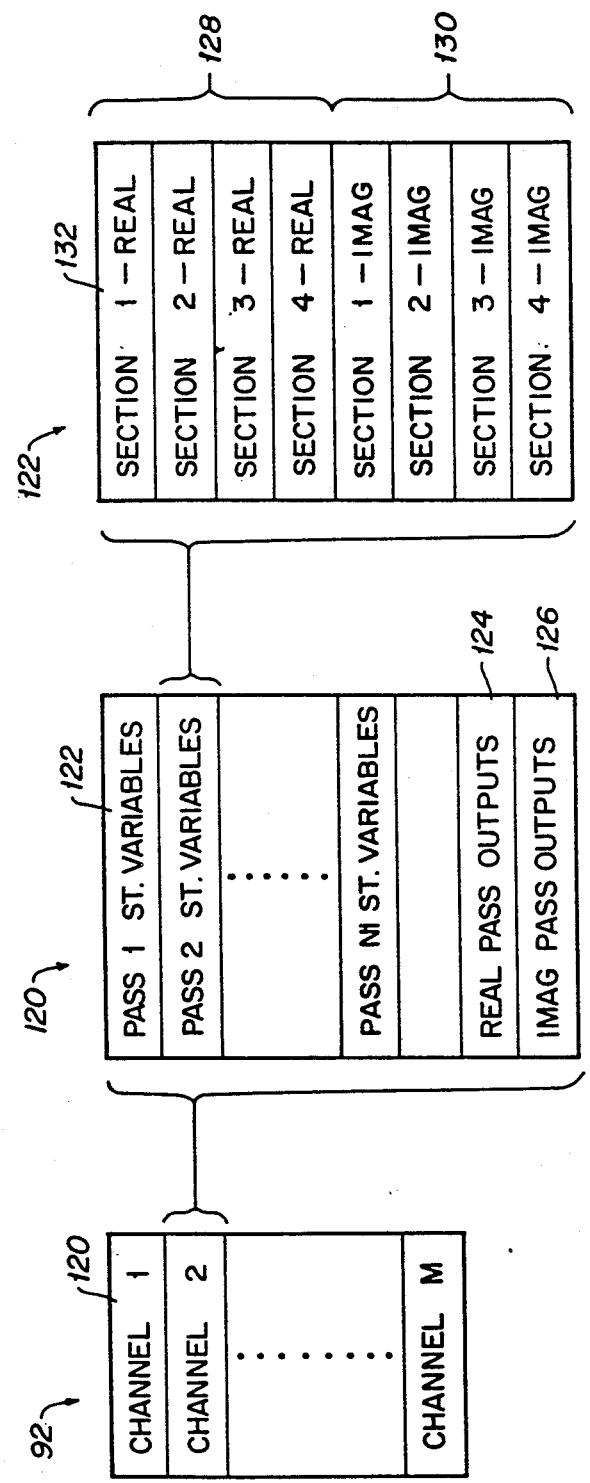
FIG. 7 is a diagram showing the arrangement of state variables and intermediate values in RAM.

In general, each low pass filter 71–79 shown in FIG. 4 may be implemented by any one of a number of well-known techniques familiar to those skilled in the art. For example, one suitable low pass filter is of the type shown in U.S. Pat. No. 4,317,092. The low pass filter shown in that patent produces an output signal with an information bandwidth substantially one-half of that of the input signal, without using multipliers or other high overhead computing techniques. One preferred embodiment of such a low pass filter is shown in FIG. 5. The low pass filter shown in FIG. 5 represents one pass, i.e., one of blocks 71–79 shown in FIG. 4. As illustrated, each pass comprises four filter sections 85–88, with the output of each of sections 85–87 being input into the following section, and the output of section 88 being the output of the respective pass block. $X_1$ through $X_{12}$ are the state variables for the low pass filter. As is well known to those skilled in the art, a low pass filter of the type shown in FIG. 5 operates in a series of processing steps or cycles. In one processing step, one new value is received as input, one new value is produced as output, and the state variables are updated in the manner indicated in FIG. 5. The vertical lines connecting the state variables in each section indicate, for example, that during a given processing step, $X_3$ is set equal to the prior value of $X_2$, and $X_2$ is set equal to the prior value of $X_1$. Particular coefficients for implementing the filter shown in FIG. 7 are described in U.S. Pat. No. 4,317,092.

Figure 6:
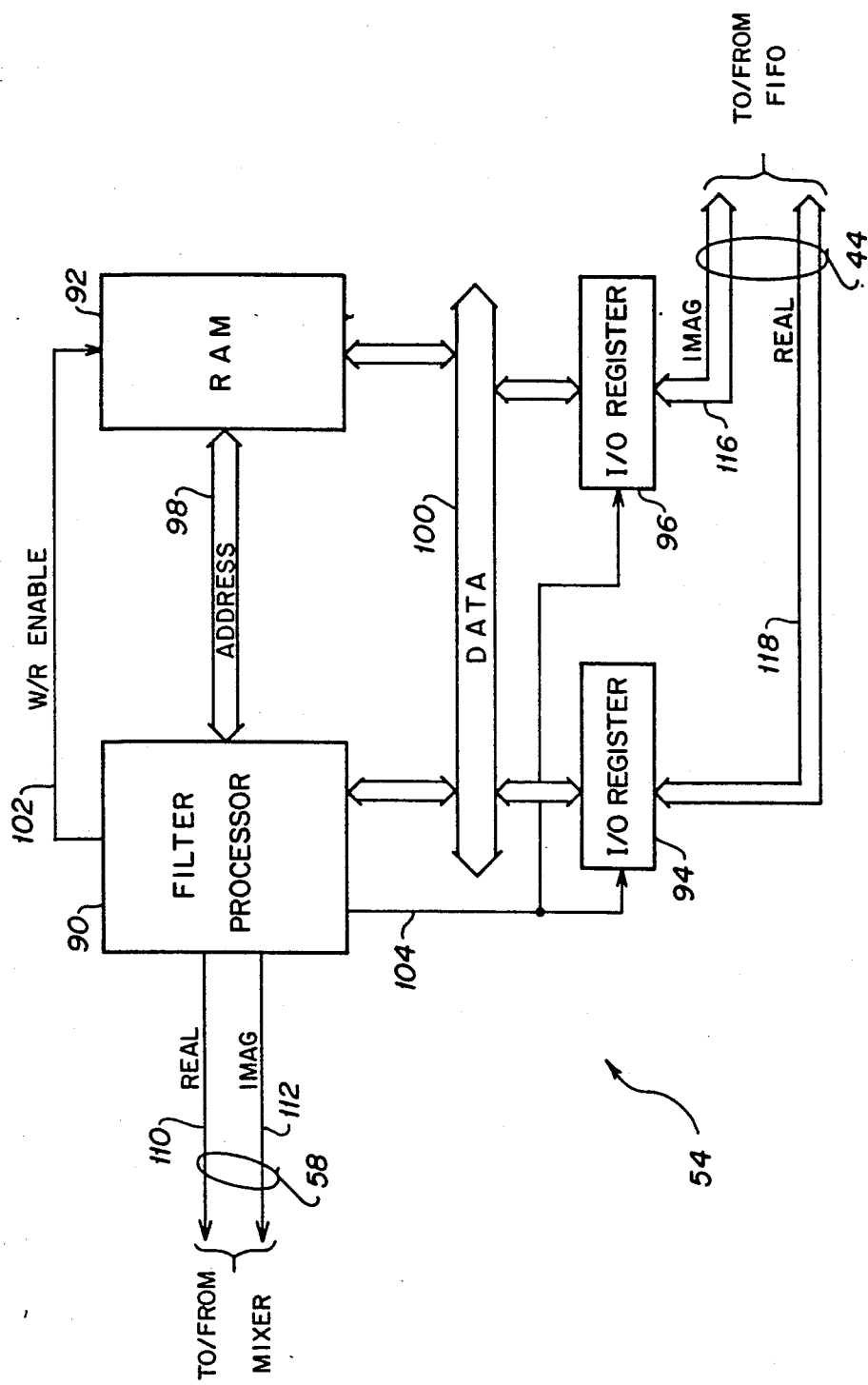
FIG. 6 is a block diagram of the multichannel filter.

A block diagram of multichannel filter 54 is set forth in FIG. 6. The multichannel filter comprises filter processor 90, RAM 92, and I/O registers 94 and 96. Filter processor 90 and RAM 92 are interconnected by address bus 98 and data bus 100. I/O registers 94 and 96 also interface with filter processor 90 and RAM 92 via data bus 100. Enable lines 102 and 104 are used by the filter processor to control the operations of RAM 92 and I/O registers 94 and 96, respectively. Multiplexed input data in serial form is received from the mixer via serial line 58 that comprises individual lines 110 and 112 for the real and imaginary data parts, respectively. Filter processor 90 performs multipass filtering on such data, using RAM 92 to store the state variables and output values for each pass of each channel. When the filter processor is ready to output data, it writes the real part of the data into I/O register 94, and the imaginary part of the data into I/O register 96. The data is then made available to FIFO output buffer 42 via bus 44 that includes individual buses 116 and 118 for the real and imaginary parts, respectively, of the filtered output data. In accordance with the present invention, the number of passes performed, the number of multiplexed channels processed, and the mode of operation (single pass output decimation, multiple pass output decimation, or interpolation) can be configured by processor 12 (FIG. 1) simply by having the processor load appropriate channel, pass and mode data into filter processor 90.

The organization of RAM 92 in one preferred embodiment of the present invention is illustrated in FIG. 7. At the largest scale, RAM 92 is divided into channel blocks 120 of 1024 words each, each channel block storing all of the state variables and intermediate output values for one channel. Each channel block is in turn divided into a series of 32-word pass blocks 122, one pass block being reserved for each of N1 passes, where N1 is the maximum number of passes for which the filter can be configured. In addition, at the top of each channel block 120, output areas 124 and 126 are set aside for storing the real and imaginary outputs respectively of the passes for the respective channel. Thus in the embodiment of FIG. 7, the maximum number of passes possible is thirty (30). For most applications, the multichannel filter can be arranged such that the maximum number of passes N1 for which the multichannel filter may be configured is on the order of twenty (20).

The right-hand portion of FIG. 7 illustrates the further breakdown of each 32-word pass block into 16-word storage areas 128 and 130 that are used for the storage of the real and imaginary portions respectively of state variables $X_1-X_{12}$ for that pass. Referring to storage area 128, this 16-word area is further subdivided into four sections 132 of four words each, the four sections corresponding to filter sections 85-88 (FIG. 5). Imaginary storage area 130 is similarly broken down into four, four-word sections. Each four-word section 132 from area 128 and the corresponding four-word section from storage area 130 stores the three state variables for one filter section. The fourth, extra data words reserved for each filter section, are used to implement an improved memory access technique described below.

Figure 8:
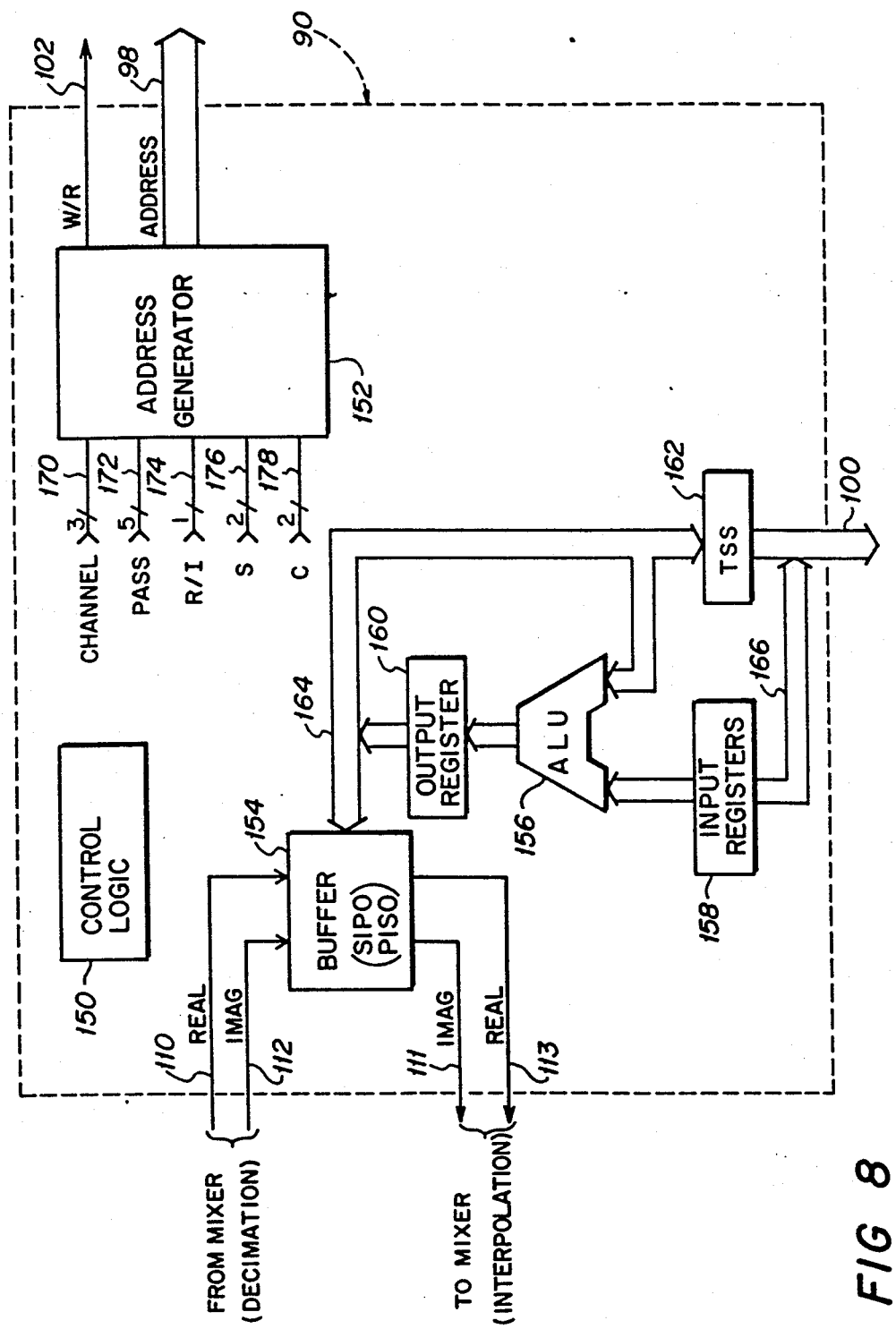
FIG. 8 is a partial block diagram of the filter processor.
Figure 10:
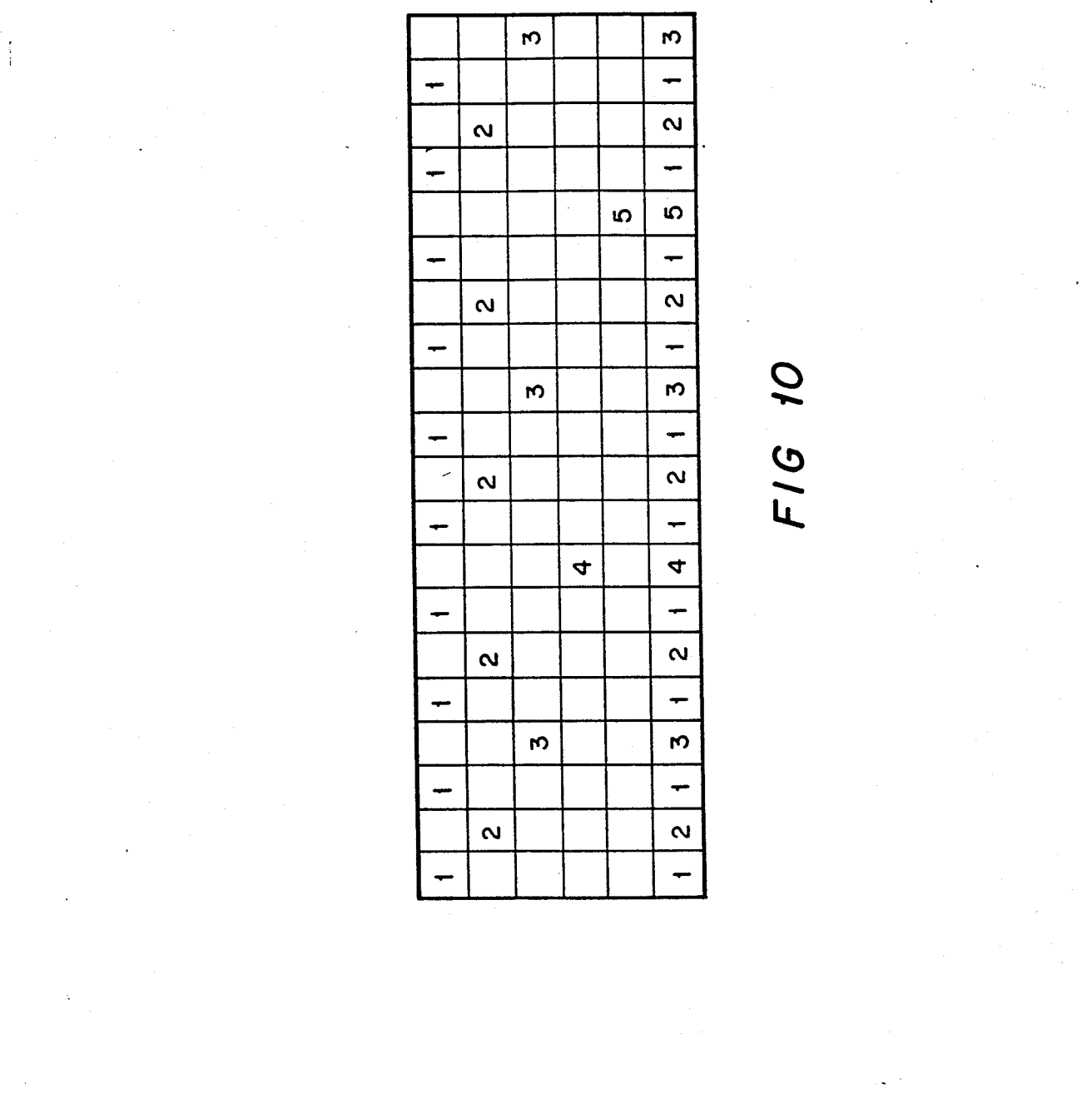

Further details of filter processor 90 are set forth in FIGS. 8-10. Referring initially to FIG. 8, filter processor 90 comprises control logic 150, address generator 152, buffer 154, and a processing section including ALU 156, input registers 158, output register 160, three state switch (TSS) 162, and buses 164 and 166. Control logic 150 generates the control signals for controlling and coordinating the operations of the filter processor, and is described in greater detail below. Address generator 152 generates the addresses on address bus 98 that are used to address RAM 92, and also generates the W/R enable signals on line 102. Buffer 154 provides the interface between the filter processor and mixer 52 (FIG. 2). In decimation mode, buffer 154 acts as a serial in, parallel out (SIPO) buffer to convert the serially transmitted, real and imaginary signals on lines 110 and 112 into parallel data words. In interpolation mode, buffer 154 acts as a parallel in, serial out (PISO) buffer to convert parallel data words on bus 164 to serial values for transmission to the mixer over lines 111 and 113. Data values retrieved from RAM 92 are input to ALU 156 via buses 100 and 166, and input registers 158. Output values produced by ALU 156 are placed in output registers 160, from which point they can be transferred to buffer 154, reinput to ALU 156, or transferred to data bus 100 via TSS 162 for writing back into RAM 92.

Address generator 152 operates in two modes to form the addresses on address bus 98. In the first and most common mode, the address generator combines five input signals to form the address. These five input signals are shown in FIG. 8, and include a three-bit channel signal on line 170, a five-bit pass signal on line 172, a one-bit R/I (real/imaginary) signal on line 174, a two-bit S (filter section) signal on line 176, and a tow-bit C signal on line 178. The significance of these signals can be explained with reference to FIG. 7. The three-bit channel signal forms the high order three bits of the address, and operates to select one of the M channel blocks 120 in RAM 92. The five-bit pass signal operates to select one of the N pass blocks 122 within the channel block. The one-bit R/I signal operates to select real storage area 128 or imaginary storage area 130 within the pass block. Within the real or imaginary storage area, the two-bit S signal selects one of the four sections 132. Finally, the two-bit C signal operates to select one of four words of each filter section. A second addressing mode is used by address generator 152 to access output areas 124 and 126 at the top of each channel block. This second addressing mode utilizes only the channel signal, the pass signal, and the R/I signal.

A preferred sequence for the operation of filter processor 90 is shown by the table set forth in FIG. 9. FIG. 9 is an example of filter processor operations when the filter processor has been configured for four channels. The extension to a system having an arbitrary number of channel will be clear from the following description. Each row in FIG. 9 represents the operation of one of the filters 71-79 shown in FIG. 4 for one processing step for a given pass and channel. For example, referring to the columns labeled "Pass" and "Channel" in FIG. 9, it can be seen that the first row in FIG. 9 represents operations performed by low pass filter 71 of FIG. 4, i.e., the low pass filter corresponding to channel 1 and pass 1.

Each row in FIG. 9 will hereafter be termed a "processing step". During each processing step, filter processor 90 performs the operations schematically illustrated in FIG. 5 for a particular channel and pass, i.e., using a particular pass block 122 in RAM 92. Thus during a processing step, the filter processor obtains a new input value, recalculates all state variables, and produces a new output value. These steps are performed by ALU 156 and associated components, in accordance with control signals provided by control logic 150. When a processing step is performed for PASS 1 of channel, the filter processor obtains its input values (real and imaginary) from lines 110 and 112 via buffer 154 (see FIG. 8). The filter processor places pass output values (real and imaginary) in output areas 124 and 126 of the respective channel block (see FIG. 7). For all passes other than PASS 1, the filter processor obtains its input values from the portions of output areas 124 and 126 that correspond to the immediately preceding pass for that channel. The method by which the filter processor outputs data to I/O registers 94 and 96 (FIG. 6) will be described below.

In FIG. 9, the numbers in the columns labeled "Pass" and "Channel" are the pass and channel numbers respectively of the associated processing step. These numbers also indicated the decimal values of the channel and pass signals, on lines 170 and 172 respectively, that are input to address generator 152. From inspection of FIG. 9, it can be seen that the processing steps may logically be grouped into sets of two processing steps each, with the first processing step of each set being PASS 1, and with both processing steps of the set corresponding to the same channel. It may further be observed that the particular pass numbers associated with a set of processing steps are repeated, while the channel number increments from one to the maximum channel number M for which the filter processor has been configured. A new set of pass numbers is then determined, and the channel number again increments from 1 to M. This pattern may also be described by stating that the channel number increments by one, or resets to one, whenever the pass number becomes one.

The techniques by which the second pass number of each set is determined is summarized in FIG. 10. In FIG. 10, each column may be conceived of as one of a series of available time slots for processing steps. In the first row of FIG. 10, the numeral 1 has been filled in every other slot. In the second row of FIG. 10, the numeral 2 has been entered in every other slot that remained unfilled after the first row was partially filled. Similarly, in the third row of the chart of FIG. 10, the numeral 3 has been entered in every other slot that remained unfilled after the entry of the numerals for the first and second rows, etc. The resulting pattern is shown in the last row of FIG. 10. Comparison of the last row of FIG. 10 to the "Pass" column in FIG. 9 shows that the FIG. 9 sequence of passes has been reproduced for the case in which the filter processor is configured for a single channel.

The pattern set forth in FIG. 10 has the property that each pass is executed only half as often as the immediately lower numbered pass, and that any number of passes can be done by carrying out a long enough sequence. Stated differently, between successive executions of PASS X, PASS X−1 is executed twice. Each time that PASS X−1 executes, it places output values (one real and one imaginary) in predetermined positions in output areas 124 and 126 in RAM 92. Since the outputs of PASS X−1 are utilized only by PASS X of the same channel, it may be seen that after each execution of PASS X, PASS X−1 writes a first complex output value into the output areas, and PASS X−1 is then reexecuted and overwrites that value with a second complex output value written into the same locations. PASS X is then executed, and thereby receives and acts upon only the second complex output value from PASS X−1. This technique implements the functions indicated by switches 84 in FIG. 4, i.e., decimation occurs because every other output from a given pass is overwritten by the same pass before being input to the next higher pass or output via I/O registers 94 and 96.

Figure 11:
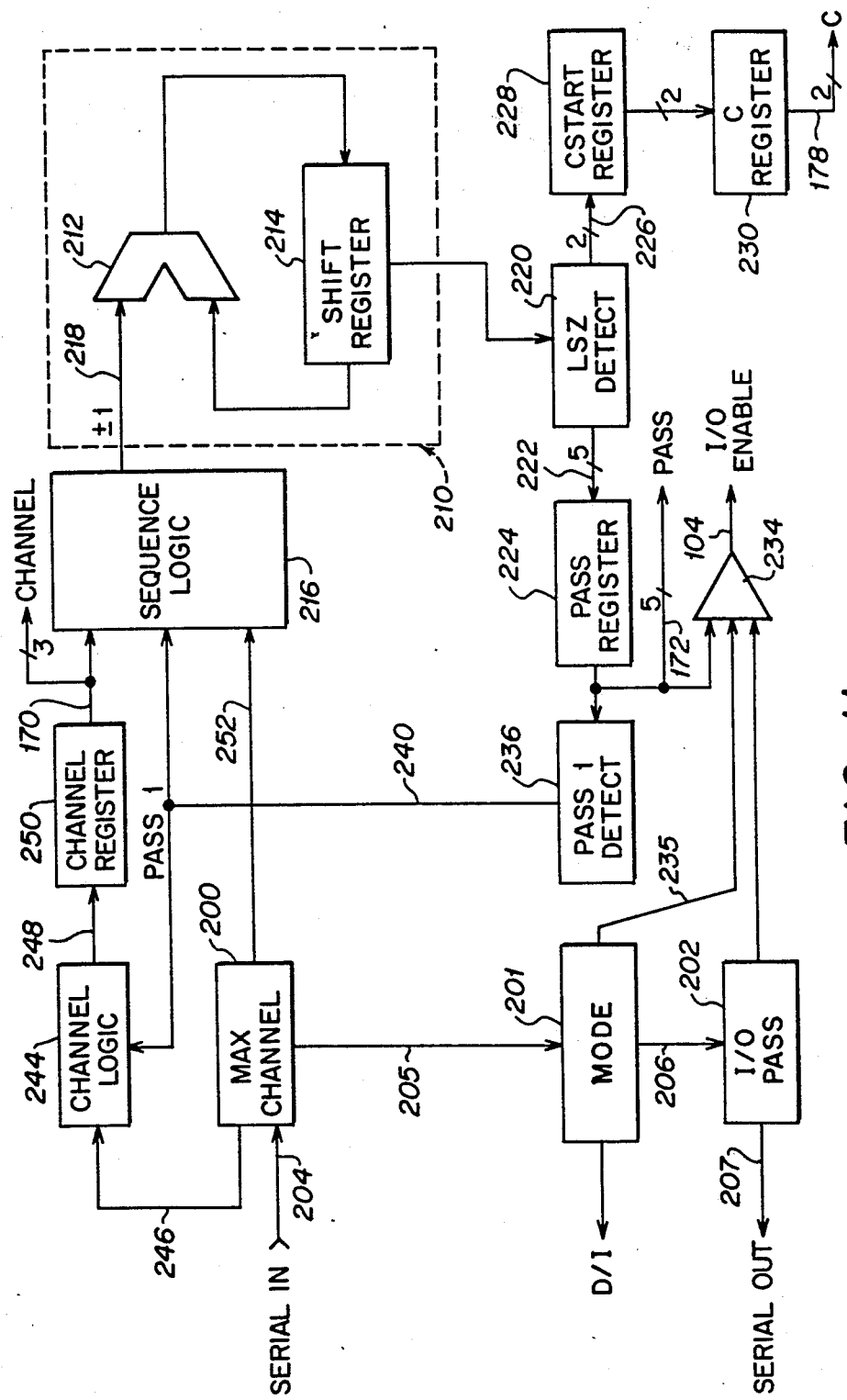
FIG. 11 is a block diagram showing a portion of the control logic of the filter processor.

A preferred arrangement for deriving the sequences of pass and channel numbers shown in FIGS. 9 and 10 is indicated in FIG. 11. FIG. 11 illustrates a portion of control logic 150 shown in FIG. 8. The control logic components shown in FIG. 11 include maximum channel register 200 (left center of Figure), mode register 201, and maximum pass register 202 interconnected by data lines 204–207. Data line 204 is a Serial In line connected to processor 12 and line 207 is a Serial Out line also connected to processor 12. The processor utilizes this serial data path to load parameters into registers 200–202. In particular, the processor loads a maximum channel value M into register 200, a maximum pass value N into register 202, and a mode flag into register 201. The maximum channel and pass number values are used to generate the sequences indicated in FIGS. 9 and 10. The mode flag is used to indicate decimation (single or multiple pass output) or interpolation mode.

The operation of the components shown in FIG. 11 can best begin with binary up/down counter 210 shown in the upper right portion of the figure. In the illustrated embodiment, counter 210 comprises serial adder 212 and shift register 214. Once each processing step, serial adder 212 receives a digital word from sequence logic 216 that represents either an increment function (+1) or a decrement function (−1). The serial adder then operates in a conventional manner to respectively increment or decrement the value stored in shift register 214 by 1, thereby implementing a binary up/down counter operation. The adder inputs provided by sequence logic 216 on line 218 are indicated in the left-hand column of FIG. 9. Columns two and three of FIG. 9 illustrate the decimal and binary representations respectively of the contents of shift register 214 in response to the indicated series of inputs on line 218, it being assumed that the shift register was initialized to a value of zero.

The contents of shift register 214 are examined by least significant zero detector (LSZ detect) circuit 220. LSZ detect circuit 220 produces a five-bit binary signal on line 222 that indicates the position of the least significant zero in shift register 214. These positions are indicated by the square boxes surrounding the least significant zeroes in the third column of FIG. 9. This position value is loaded into pass register 224, and becomes the pass number shown in the fourth column of FIG. 9. The output of pass register 224 is the five-bit pass signal on line 172 that is utilized by address generator 152 (FIG. 8). At the same time that LSZ detect circuit 220 produces the pass value on line 222, it produces a two-bit CSTART signal on line 226 that is loaded into CSTART register 228. The two-bit CSTART value is derived by the LSZ detect circuit by extracting the two bits immediately adjacent to and more significant than the bit containing the least significant zero in shift register 214. The resulting CSTART values (in decimal) are indicated in the fifth column of FIG. 9. The output of CSTART register 228 is used to initialize C register 230 at the beginning of each processing step. The output of C register 230 is the two-bit C signal on line 178 that is also utilized by address generator 152. The CSTART register is used to implement an improved memory access technique as described below. It will be apparent from FIG. 9 that the CSTART value will increment by one, modulo 4, for each successive execution of a given pass.

The pass signal on line 172 is input to comparator 234 and PASS 1 detect circuit 236. Comparator 234 compares the pass signal with the maximum pass value N stored in register 202, based upon the mode data received via line 235. In single pass output decimation mode or interpolation mode, the comparator issues an I/O enable signal on line 104 when the pass signal equals N. When the mode data indicates multiple pass output decimation mode, comparator 234 issues the I/O enable signal whenever the pass signal is greater than or equal to N. The output enable signal is used as shown in FIG. 6 to enable the loading of data values into I/O registers 94 and 96 from data bus 100. Thus for example if the maximum pass value stored in maximum pass resister 202 was five, and if the mode was single pass output decimation mode, then the output values (real and imaginary) produced by PASS 5 would be written into I/O registers 94 and 96, as well as being stored in their appropriate locations in output areas 124 and 126 in RAM 92. If the mode was multiple pass output decimation mode, then the output values produced by all passes 5 through N1 would be written into I/O registers 94 and 96. In a preferred embodiment, this is the only effect produced by the value N in maximum pass register 202. Thus filter processor 90 always executes a predetermined number N1 of passes (e.g. 20 passes), and the maximum pass value N specified by processor 12 simply controls the pass number or numbers from which the output will be derived. Although the described system will in many cases perform unnecessary calculations, this technique greatly simplifies the implementation of filter processor 90, and permits the filter processor to be readily reconfigured to perform the filtering operation with a variable number of passes.

PASS 1 detect circuit 236 shown in FIG. 11 produces a PASS 1 signal on line 240 whenever the pass signal on line 172 indicates PASS 1. The PASS 1 signal is input to sequence logic 216, as well as to channel logic 244. Referring to FIG. 9, channel logic 244 maintains an internal channel count that it increments whenever the PASS 1 signal is received on line 240. Channel logic 244 generates a channel number signal m on line 248 that is input to and stored in channel register 250. Whenever the channel count m maintained by channel logic 244 exceeds the maximum channel number M on line 246, the channel logic resets the channel count m to one. The channel number stored in channel register 250 is provided on line 170 to sequence logic 216 and to other portions of the filter processor, including address generator 152.

Sequence logic 216 uses the channel number m, the maximum channel value M, and the PASS 1 signal to produce the appropriate sequence of increment (+1) and decrement (−1) signals on line 218. Referring to the first column of FIG. 9, it can be seen that the sequence can be described as alternating +1 and −1 signals, with every Mth −1 signal changed to a +1 signal, where M is the maximum number of channels. Thus sequence logic 216 alternates between +1 and −1 signals, and changes a particular −1 signal to a +1 signal when the PASS 1 signal on line 240 (for the preceding processing step) is not present and the channel number signal m on line 170 is equal to the maximum channel number signal M provided by maximum channel register 200 on line 252.

Figures 12, 13:
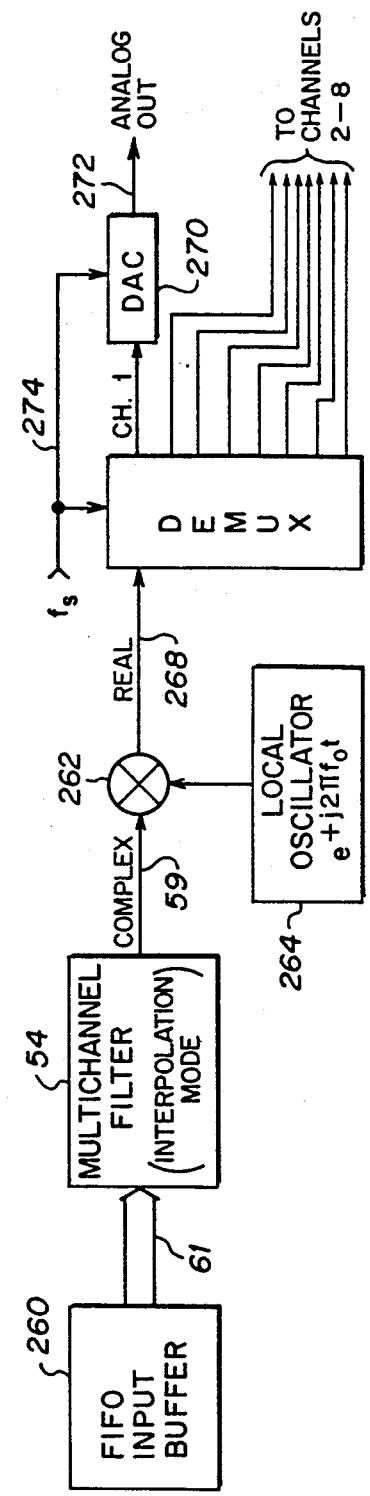
FIG. 12 is a chart illustrating the memory utilization technique for state variables.
FIG. 13 is a block diagram of a portion of a data source system that includes the multichannel filter of the present invention.

Referring again to FIG. 5, it can be seen that for filter section 85, the operations performed during each processing step include setting a new $X_3$ value based on the current value of $X_2$, and setting a new $X_2$ value based on the current value of $X_1$. Entirely analogous operations are performed for each of filter sections 86–88. This feature is used, in accordance with the present invention, to implement an efficient memory utilization technique. FIG. 12 provides an example of the storage of state variables $X_1$-$X_3$ for filter section 85. The four rows shown in FIG. 12 correspond to the four words in one of the four-word sections 132 from area 128 (FIG. 7), and the corresponding four-word section from area 130. As indicated, at processing step i, the values $X_3$, $X_2$, and $X_1$ are stored in descending order, with the fourth word of the section containing garbage, indicated by a dash. The left-hand column of FIG. 12 contains the relative addresses in the corresponding section 132 of RAM 92 of the four words comprising the section. The asterisk in each column indicates the corresponding CSTART value for that step. In this example, the value of CSTART for step i is 01. The filter processor executes each processing step using the following series of operations:

C=CSTART
Read $X_2$ from address C
C=(C+1) modulo 4
Read $X_1$ from address C
C=(C+1) modulo 4
Write new $X_1$ to address C
C=(C+1) modulo 4
Read $X_3$ from address C As the result of the above steps, the positions of the state variables in memory will be as indicated in the step i +1 column in FIG. 12. The next time that this filter section is executed will be the next time that this pass is executed, at which time CSTART will be one greater, i.e., CSTART will equal 10, as indicated by the asterisk under the step i +1 column. The fact that CSTART increments by one each time that a given pass (for a given channel) is repeated can be verified from FIG. 9. For processing step i +1, the operations set forth above are repeated, resulting in the configuration shown in the step i +2 column in FIG. 12. This process continues indefinitely, with the state variables "walking" around the four allocated memory words. It may be seen from FIG. 12 that in step i +4, the configuration of step i has been reproduced. As a result of this memory utilization technique, the number of read and write operations for each processing step is significantly reduced, thereby saving processing time.

FIG. 13 presents a block diagram of a typical data source system for utilizing the multichannel filter of the present invention in interpolation mode. The system shown in FIG. 13 includes FIFO input buffer 260 that provides a stream of M channel, multiplexed, complex digital values to multichannel filter 54 via bus 61, bus 61 corresponding to bus 60 shown in FIGS. 2 and 6. As with bus 60, bus 61 comprises a pair of buses, one for the real and one for the imaginary portion of each data value. Multichannel filter 54 interpolates the data values for each channel, and provides the resulting output values in serial form on line 59 that comprises lines 111 and 113 shown in FIG. 8. This complex serial data is provided to mixer 262 that mixes the output data for each channel with the mixing function $e^{+j2\pi f_0 t}$ provided by local oscillator 264. Mixer 262 extracts the real portion of each resulting data value, and provides such real portion to demultiplexer 266 via line 268. Demultiplexer 266 sorts the data from mixer 262 into M individual channels, based on the sample clock signal $f_s$ on line 274. FIG. 13 illustrates the channel 1 data going to digital-to-analog converter (DAC) 270, resulting in an analog output signal on line 272 that may be further processed through an anti-aliasing filter and/or a variable gain amplifier, depending upon its intended application. Output data for other channels is similarly processed.

Figure 14A:
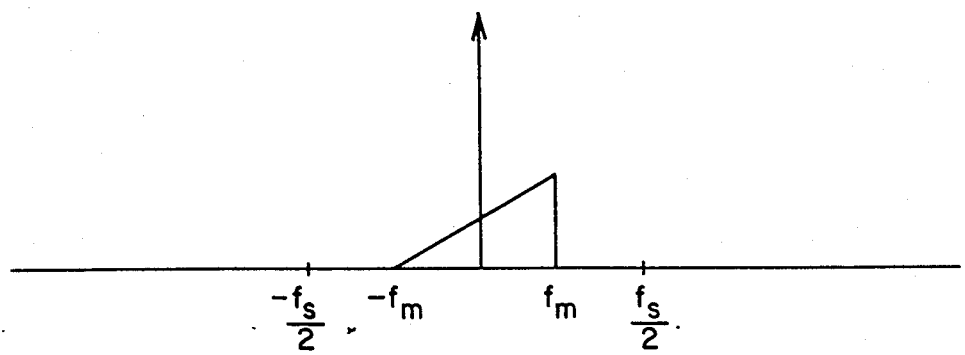
FIGS. 14A, 14B and 14C are graphs showing the effect of mooz filtering on an input signal.
Figure 14B:
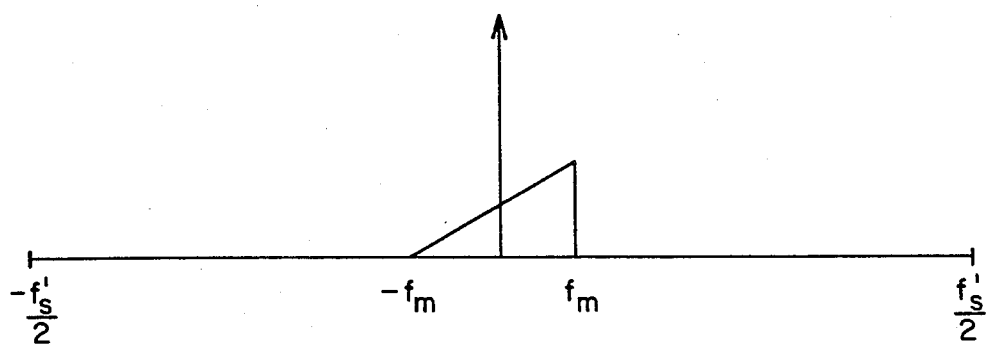
Figure 14C:
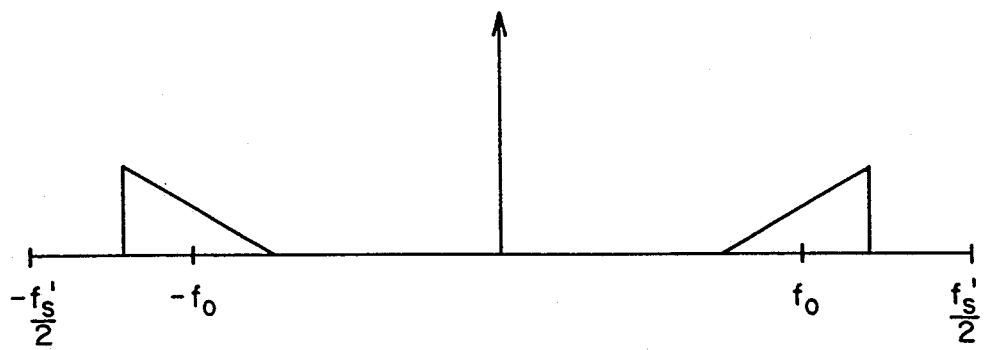

The combination of multichannel filter 54 operating in interpolation mode, mixer 262 and local oscillator 264 comprise what is commonly known as a mooz filter. The effect of the mooz filtering operation is illustrated in FIGS. 14A–14C. FIG. 14A shows the frequency spectrum of a hypothetical input signal for a single channel. As indicated, the spectrum extends from $-f_m$ to $+f_m$, where the sampling frequency $f_s$ is at least twice $f_m$. The mooz filter operates to increase the sampling rate by some specified amount, and then to frequency shift the resulting signal to a desired center frequency. This is accomplished by first interpolating the input data, e.g., by filling in new data points between the existing samples. By the very nature of the interpolation operation, the original signal is represented by more data points, which means the sample frequency has increased to a new value $f_s'$ (FIGS. 14B). Once the sample frequency has been increased, the signal is modulated by the function $e^{+j2\pi f_o t}$, which shifts the frequency spectrum to the right by $f_o$. At this time, the imaginary portion of the data is discarded, which has the effect of creating a mirror image of the shifted spectrum located at $-f_o$ (FIG. 14C). It will be apparent that the use of a local oscillator/mixer is not required if the final spectrum is to be located at or near the origin.

Figure 15:
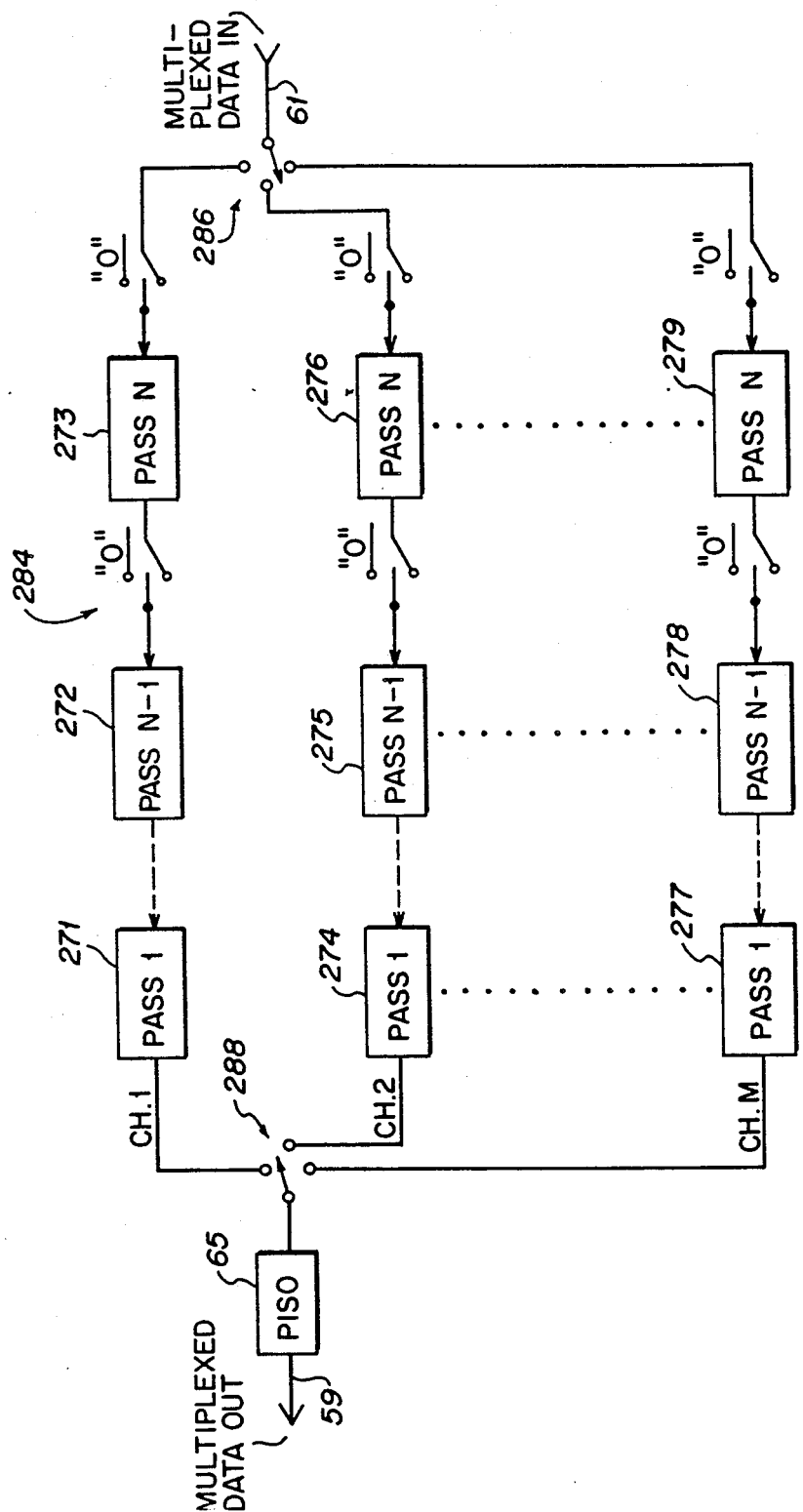
FIG. 15 is a schematic diagram showing the arrangement of low pass filters in interpolation mode.

The data flow and the arrangement of the low pass filters of multichannel filter 54 in interpolation mode is set forth in FIG. 15. As with the decimation mode operation shown in FIG. 4, the multichannel filter comprises N low pass filters for each of M channels. Data input via bus 61 is routed to the appropriate low pass filter N through "switch" 286, depending on the channel to which the data pertains. For each channel, the data passes to the left through a series of N low pass filters, and finally emerges through "switch" 288 as output data that is converted by parallel in/serial out (PISO) buffer 65 into serial output data on line 59. The interpolation function is symbolically illustrated by switches 284. Each low pass filter receives every other data value from the preceding (higher numbered) low pass filter, or from switch 286 in the case of low pass filter N, and receives null (i.e., zero) values for its remaining input values. Thus for a total of N passes, the sampling rate is increased by a factor of $2^N$.

The operation sequence shown in FIG. 9 is unchanged when multichannel filter 54 is operating in interpolation mode. In general, the D/I flag stored in register 201 will cause two changes in the operation of the filter processor. The first change relates to the fact that in interpolation mode, each low pass filter n receives its input from low pass filter n+1. Since low pass filter n+1 ie executed only half as often as low pass filter n, the address generated by address generator 152 for acessing values in output areas 124 and 126 of RAM 92 must be adjusted such that pass n retrieves the output of pass n+1 rather than the output of pass n−1, such that pass N receives its input from bus 61 via I/O registers 94 and 96, such that a zero value is input to each pass every other time that the pass is executed. A second difference in interpolation mode may be required if the coefficients of the filter shown in FIG. 5 are not scaled to provide unity overall gain. Such considerations will be readily apparent to those skilled in the art.

While the preferred embodiments of the invention have been illustrated and described, a number of variations will be apparent to those skilled in the art. For this reason, the invention is not to be limited to the specific embodiments described, and the true scope of the invention is to be determined by reference to the following claims.

The embodiments of the invention in which an exclusive property or privilege is claimed are defined as follows:

1. An apparatus comprising:
   input means for providing an input digital signal, and input digital signal being comprised of a plurality of samples provided at a first rate;
   signal processing means having an input coupled to the input means for processing the samples comprising the input digital signal and for producing a first output signal, said processing means including means for processing signal samples at a second rate greater than the first, said second rate defining a characteristic processing interval for processing a single signal sample, the difference between the second and first rates leaving unused processing intervals during which the processing means is not processing samples to the input digital signal, said signal processing means processing samples of the first output signal during certain of said unused processing intervals.

2. The apparatus of claim 1 which further includes:
   means for providing to the processing means sets of state variables characterizing the processing functions to be performed by processing means; and
   recharacterizing means for characterizing the processing function of the processing means with a first set of said state variables when processing samples of the input digital signal and for characterizing the processing function of the processing means with a second set of state variables when processing samples of the first output signal.

3. The apparatus of claim 1 in which the second rate is twice the first rate.

4. The apparatus as of claim 1 in which the processing of the samples of first output signal by the processing means yields a second output signal which is processed by the processing means during certain other of said unused processing intervals.

5. The apparatus of claim 1 in which samples of the first output signal are applied to the processing means at a rate half that at which samples of the input digital signal are applied to the processing means.

* * * * *